United States Patent
Kikuchi et al.

(10) Patent No.: US 8,227,790 B2
(45) Date of Patent: Jul. 24, 2012

(54) GROUP III NITRIDE SEMICONDUCTOR LIGHT-EMITTING DEVICE

(75) Inventors: Tomo Kikuchi, Chichibu (JP); Takashi Udagawa, Chichibu (JP)

(73) Assignee: Showa Denko K.K., Tokyo (JP)

( * ) Notice: Subject to any disclaimer, the term of this patent is extended or adjusted under 35 U.S.C. 154(b) by 87 days.

(21) Appl. No.: 12/738,757

(22) PCT Filed: Aug. 28, 2008

(86) PCT No.: PCT/JP2008/065911
§ 371 (c)(1),
(2), (4) Date: Jul. 2, 2010

(87) PCT Pub. No.: WO2009/050955
PCT Pub. Date: Apr. 23, 2009

(65) Prior Publication Data
US 2010/0288999 A1   Nov. 18, 2010

(30) Foreign Application Priority Data

Oct. 19, 2007   (JP) ................. 2007-272196

(51) Int. Cl.
*H01L 29/06*   (2006.01)

(52) U.S. Cl. .............. 257/13; 257/14; 257/94; 257/103; 257/E33.008

(58) Field of Classification Search ............ 257/13, 257/14, 94, 103, E33.008
See application file for complete search history.

(56) References Cited

U.S. PATENT DOCUMENTS

| 6,608,330 | B1 | 8/2003 | Yamada | |
|---|---|---|---|---|
| 2001/0045564 | A1* | 11/2001 | Koike et al. | 257/88 |
| 2004/0056258 | A1 | 3/2004 | Tadatomo et al. | |
| 2004/0061433 | A1 | 4/2004 | Izuno et al. | |
| 2006/0169990 | A1* | 8/2006 | Taki et al. | 257/79 |

FOREIGN PATENT DOCUMENTS

| JP | 55-3834 B2 | 1/1980 |
|---|---|---|
| JP | 7-335942 A | 12/1995 |
| JP | 2001-28458 A | 1/2001 |
| JP | 2001-028458 A1 | 1/2001 |
| JP | 2001-60719 A | 3/2001 |
| JP | 2001-257379 A | 9/2001 |
| JP | 2002-176198 A | 6/2002 |
| JP | 2002-261334 A | 9/2002 |
| JP | 2004-179493 A | 6/2004 |
| JP | 2006-324685 A | 11/2006 |
| WO | 02/49121 A1 | 6/2002 |

* cited by examiner

*Primary Examiner* — Jami M Valentine
(74) *Attorney, Agent, or Firm* — Sughrue Mion, PLLC

(57) ABSTRACT

In a Group III nitride semiconductor light-emitting device which includes a substrate (1) and a light-emitting layer (10) having a multiple quantum well structure including a barrier layer (11$b$, 12$b$), which is provided on a surface of the substrate and formed of a Group III nitride semiconductor, and a well layer (11$a$, 12$a$) formed of an indium-containing Group III nitride semiconductor, the light-emitting layer is constituted by stacking a plurality of multilayer portions (11, 12) which have one unit multilayer portion (11$m$) including the well layer and the barrier layer or two or more stacked unit multilayer portions (12$m$). When the multilayer portion (12) includes two or more unit multilayer portions (12$m$), the respective well or barrier layers have the same thickness and composition, and in the respective multilayer portions (11, 12), the barrier layers of the unit multilayer portions are different in thickness with respect to one another.

4 Claims, 8 Drawing Sheets

GROUP III NITRIDE SEMICONDUCTOR LIGHT-EMITTING DEVICE

CROSS REFERENCE TO RELATED APPLICATIONS

This application is a National Stage of International Application No. PCT/JP2008/065911 filed Aug. 28, 2008, claiming priority based on Japanese Patent Application No. 2007-272196 filed Oct. 19, 2007, the contents of all of which are incorporated herein by reference in their entirety.

TECHNICAL FIELD

The present invention relates to a Group III nitride semiconductor light-emitting device comprising a substrate and a light-emitting layer having a multiple quantum well structure, which comprises a barrier layer, provided on a surface of the substrate and formed of a Group III nitride semiconductor material, and a well layer formed of an indium-containing Group III nitride semiconductor.

BACKGROUND ART

A Group III nitride semiconductor material such as a gallium indium nitride mixed crystal ($Ga_xIn_{1-x}N$: $0<x<1$) has been used conventionally for constituting a light-emitting layer of a light-emitting diode (abbr.: LED) emitting blue or green short wavelength light or a laser diode (abbr.: LD) (see, for example, JP-B No. 55-3834). Aluminum gallium nitride (composition formula $Al_xGa_{1-x}N$: $0 \leqq X \leqq 1$) has been used as a material used for constituting a light-emitting layer having a quantum well structure of a near-ultraviolet or ultraviolet LED (see, for example, JP-A No. 2001-60719).

A Group III nitride semiconductor LED comprising a Group III nitride semiconductor layer as a light-emitting layer is combined with an LED comprising a light-emitting layer constituted of a nitride semiconductor layer except a Group III nitride semiconductor layer, for example, a Group III-V nitride semiconductor layer and thereby is used for constituting a multicolor emission LED. For example, blue and green LEDs respectively comprising, as light-emitting layers, $Ga_xIn_{1-x}N$ layers with different indium (In) compositions (=1−X) and a red LED comprising an aluminum gallium arsenide mixed crystal (AlGaAs) as a light-emitting layer are assembled and thereby a light-emitting device which emits light of each color of R (red), G (green), and B (blue) or emits white light by mixing these colors is produced (see, for example, JP-A No. 7-335942).

As another type of conventional white LED, there is an LED of a two-wavelength light-emitting type utilizing a technique of forming respective light-emitting layers emitting lights in a relation of complementary colors on a single substrate. For example, a light-emitting layer having a multiple quantum well structure, which comprises five $Ga_xIn_{1-x}N$ ($0 \leqq X \leqq 1$) well layers emitting blue light, and a light-emitting layer having a multiple quantum well structure emitting yellow light and comprising ten pairs of AlInP/AlGaInP are respectively formed on the same substrate, and two lights with different colors and wavelengths (for example, blue and yellow lights) emitted respectively from the light-emitting layers are mixed, whereby a two-wavelength light-emitting white LED is provided (see, for example, JP-A No. 2001-257379).

However, when the conventional LED which emits a plurality of lights with different wavelengths (multiwavelength emission) is constituted, it is necessary to separately provide light-emitting layers formed of a Group III-V compound semiconductor material suitable for emitting each color. For example, when an LED emitting each color of RGB is produced, as described above, light-emitting layers respectively emitting R (red), G (green), and B (blue) are required to be formed of different Group III-V compound semiconductor materials. Namely, LED which easily provides multiwavelength emission using a single light-emitting layer independently constituted of a Group III nitride semiconductor layer could not have been produced.

The present invention has been proposed in view of the above circumstances and an object thereof is to provide a Group III nitride semiconductor light-emitting device which can easily emit multiwavelength light with a simple constitution, using a single light-emitting layer independently constituted of a Group III nitride semiconductor layer.

DISCLOSURE OF THE INVENTION

In order to achieve the above objects, (1) a first aspect of the invention is characterized in that, in a Group III nitride semiconductor light-emitting device which comprises a substrate and a light-emitting layer having a multiple quantum well structure comprising a barrier layer, which is provided on a surface of the substrate and formed of a Group III nitride semiconductor, and a well layer formed of an indium-containing Group III nitride semiconductor, the light-emitting layer having the multiple quantum well structure is constituted by stacking a plurality of multilayer portions which comprise one unit multilayer portion comprising the well layer and the barrier layer or two or more stacked unit multilayer portions. When the multilayer portion comprises two or more unit multilayer portions, the respective well layers or the respective barrier layers have the same thickness and composition, and in the respective multilayer portions, the barrier layers of the unit multilayer portions are different in thickness with respect to one another.

(2) According to a second aspect of the invention, in the constitution of the invention described in (1), in the light-emitting layer, the number of the stacked unit multilayer portions having the barrier layer with the largest thickness is smaller than the summation of the number of the stacked unit multilayer portions having the barrier layer with a thinner thickness.

(3) According to a third aspect of the invention, in the constitution of the invention described in (1) or (2), in the respective multilayer portions, the well layers of the unit multilayer portions are different in at least one of thickness and composition with respect to one another.

(4) According to a fourth aspect of the invention, in the constitution of the invention described in any one of (1) to (3), in the light-emitting layer, the multilayer portions are arranged from the surface side of the substrate toward a direction of taking out light emitted by the light-emitting layer in the order that the multilayer portion emits lights of shorter wavelength.

(5) According to a fifth aspect of the invention, in the constitution of the invention described in (4), in the light-emitting layer, the multilayer portions are arranged in the sequence that the thicknesses of the well layers of the multilayer portions become thinner from the surface side of the substrate toward the direction of taking out light emitted by the light-emitting layer.

According to the first aspect of the invention, the light-emitting layer having the multiple quantum well structure is constituted by stacking a plurality of multilayer portions which comprise one or two or more stacked unit multilayer portions comprising the well layer and the barrier layer, and in the respective multilayer portions, the barrier layers of the unit multilayer portions are different in thickness with respect to one another. The smaller the thickness of the barrier layer, the easier the transmission of light (electron wave) emitted from the well layer, and therefore, the reduction in thickness of the barrier layer can increase the intensity of the multiwavelength light emitted from the well layer in a wide wavelength range. Thus, there can be obtained the effect that the wavelength of light emitted from a single light-emitting layer having the multiple quantum well structure can be further multiplexed, and white light can be easily obtained with a simple constitution. Consequently, the light-emitting layers each emitting red, green, and blue light or light-emitting layers emitting lights of two colors in a complementary relation are not required to be separately provided.

According to the second aspect of the invention, in the light-emitting layer having the multiple quantumwell structure, the number of the stacked unit multilayer portions having the barrier layer with the largest thickness is smaller than the summation of the number of the stacked unit multilayer portions having the barrier layer with a thinner thickness. Therefore, the intensity of the multiwavelength light emitted from the well layer can be effectively increased in a wide wavelength range, and the wavelength range can be further widened.

According to the third aspect of the invention, in the respective multilayer portions, the well layers of the unit multilayer portions are different in at least one of thickness or composition with respect to one another. When the well layers are different from each other in thickness or composition, the well layers emit lights with different wavelengths accordingly. Thus, the wavelength of the light emitted from a single light-emitting layer having the multiple quantum well structure can be further multiplexed, and the wavelength range can be widened.

According to the fourth and fifth aspects of the invention, in, the light-emitting layer, the multilayer portions are respectively arranged in the order that, from the surface side of the substrate toward the direction of taking out light emitted from the light-emitting layer, the wavelength of the light emitted from the multilayer portion becomes shorter, for example, in the order that the thickness of the well layer of the multilayer portion becomes shorter. Namely, the light-emitting layer having the multiple quantum well structure is constituted so that the well layer having a large width and providing multi-wavelength emission having a low quantum level and including a long-wavelength emission component is disposed on the surface side of the substrate, and the well layer having a small width and providing multiwavelength emission having a high quantum level and including a shorter wavelength emission component is disposed in the light-emission taking-out direction. Although short-wavelength light is absorbed in the well layer emitting long-wavelength light, by virtue of the constitution that none of the short-wavelength light passes through the well layer which emits a longer wavelength light, the light emitted from the well layer disposed on the substrate surface side can be taken out in an external visual field direction without being absorbed in the well layer disposed in the light-emission taking-out direction, and the light emitted from each well layer can be efficiently taken out in a visual field direction.

BEST MODE FOR CARRYING OUT THE INVENTION

Figure 1:
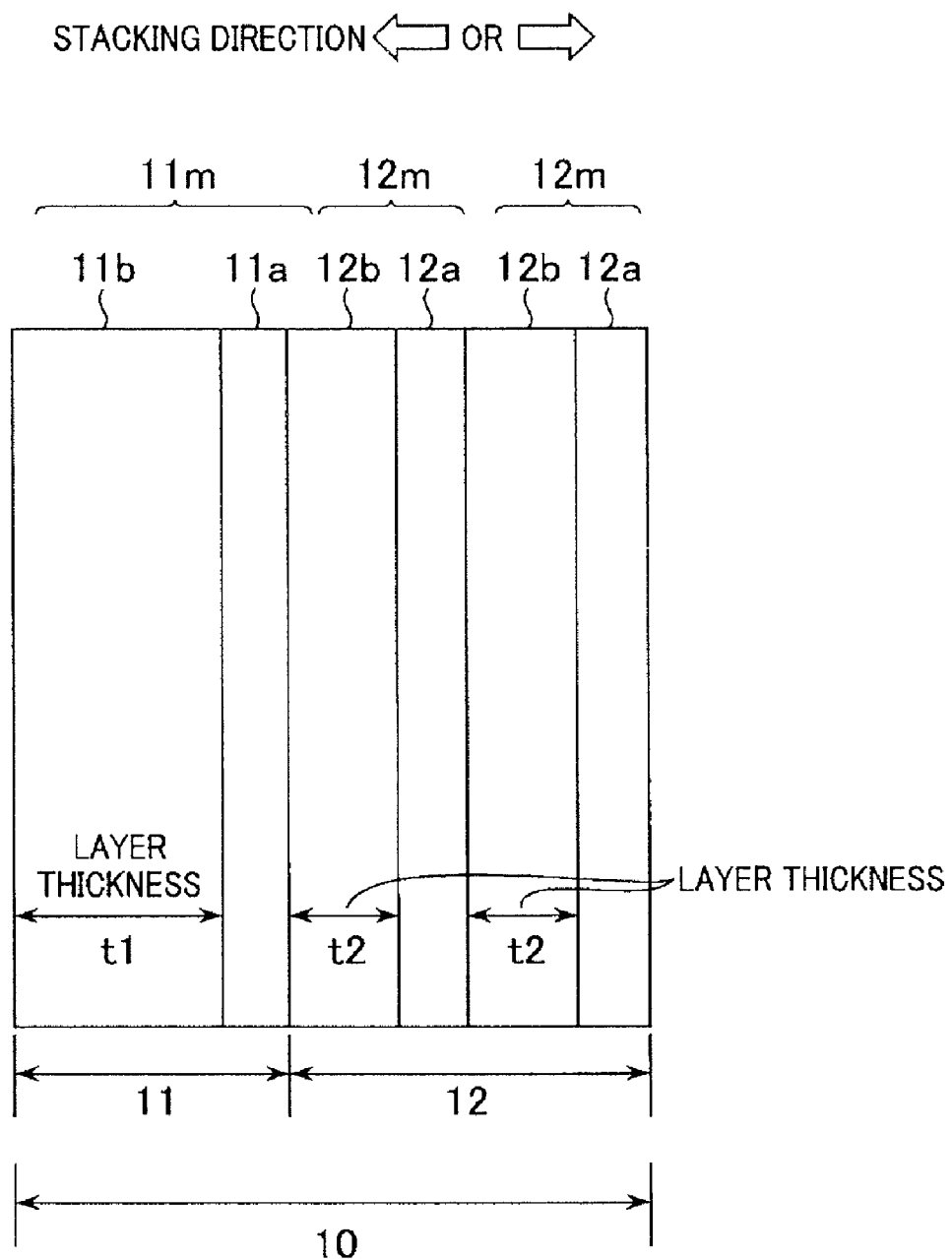
FIG. 1 is a schematic view showing a stacked relation of multilayer portions according to the present invention.

Embodiments of the present invention will be described in detail referring to the drawings.

FIG. 1 is a schematic view showing a stacked relation of multilayer portions according to the present invention. A light-emitting layer 10 having a multiple quantum well structure according to the present invention shown in FIG. 1 is constituted by stacking multilayer portions 11 and 12. The multilayer portion 11 has one unit multilayer portion 11$m$ comprising a well layer 11$a$ and a barrier layer 11$b$. The multilayer portion 12 is constituted of stacked two unit multilayer portions 12$m$ each comprising a well layer 12$a$ and a barrier layer 12$b$. The respective well layers 12$a$ constituting the two unit multilayer portions 12$m$ have the same thickness and composition, and the respective barrier layers 12$b$ constituting the two unit multilayer portions 12$m$ also have the same thickness and composition. A thickness t1 of the barrier layer 11$b$ of the multilayer portion 11 and a thickness t2 of the barrier layer 12$b$ of the multilayer portion 12 are different from each other.

The light-emitting layer of the present invention is constituted by stacking a plurality of multilayer portions comprising one unit multilayer portion which comprises a well layer and a barrier layer or two or more stacked unit multilayer portions. When the multilayer portion has two or more unit multilayer portions, the respective well layers and the respective barrier layers have the same thickness and composition. In the respective multilayer portions, the barrier layers of the unit multilayer portions have different thicknesses with respect to one another.

The barrier layer constituting each unit multilayer portion of the multilayer portion is preferably constituted of a Group III nitride semiconductor layer such as $Al_XGa_{1-X}N$ ($0 \leq X \leq 1$) which can be joined to the well layer with a barrier difference between the well layer and the barrier layer. The barrier layer and the well layer are constituted of Group III nitride semiconductor layers having the same conduction type. The thickness of the barrier layer is in a range of approximately not less than 3 nm and not more than 30 nm, and it is preferable that the barrier layer has a thickness that allows an electron wave to sufficiently pass through the barrier layer.

When the light-emitting layer having the multiple quantum well structure is formed by a stack of multilayer portions, the number of the stacked multilayer portions is not limited. However, in order to avoid unnecessary redundancy of the formation process of the light-emitting layer, the number of the stacked multilayer portions is preferably approximately not more than 50, more preferably not more than 30. In order to obtain a light-emitting layer having a multiple quantum well structure which can emit multiwavelength light, it is advantageous that the light-emitting layer is constituted so that the number of the unit multilayer portions including a barrier layer of the thickness $t_1$ ($t_1 \neq 0$) is smaller than the number of the unit multilayer portions including a barrier layer of a thickness $t_2$ smaller than the thickness $t_1$ ($t_1 > t_2$, $t_2 \neq 0$). The smaller the thickness of the barrier layer, the better the transmission of an electron wave, and high intensity multiwavelength emission can be obtained.

Further, in the light-emitting layer, it is advantageous for obtaining a light-emitting layer providing multiwavelength light that the number of stacked unit multilayer portions having a barrier layer with the largest thickness is smaller than the total number of stacked unit multilayer portions having a barrier layer with a smaller thickness. For example, in the light-emitting layer, when the total number of the unit multilayer portions is 10, the number of the unit multilayer portions of the multilayer portion having a barrier layer with a thickness t1 (t1≠0) is 5, and the number of the unit multilayer portions of the multilayer portion having a barrier layer with a smaller thickness t2 (t1>t2, t2≠0) is 5. Meanwhile, in the light-emitting layer, when the total number of the unit multilayer portions is 20, the number of the unit multilayer portions of the multilayer portion having a barrier layer with the thickness t1 (t1≠0) remains 5, and the number of the multilayer portions having a barrier layer with a smaller thickness t2 (t1>t2, t2≠0) is 15. When the number of stacked unit multilayer portions having a barrier layer with the largest thickness is smaller than the total number of stacked unit multilayer portions having a barrier layer with a smaller thickness, it is advantageous for obtaining a light-emitting layer providing multiwavelength light. This fact will be described in more detail using FIGS. 2 to 5.

Figure 2:
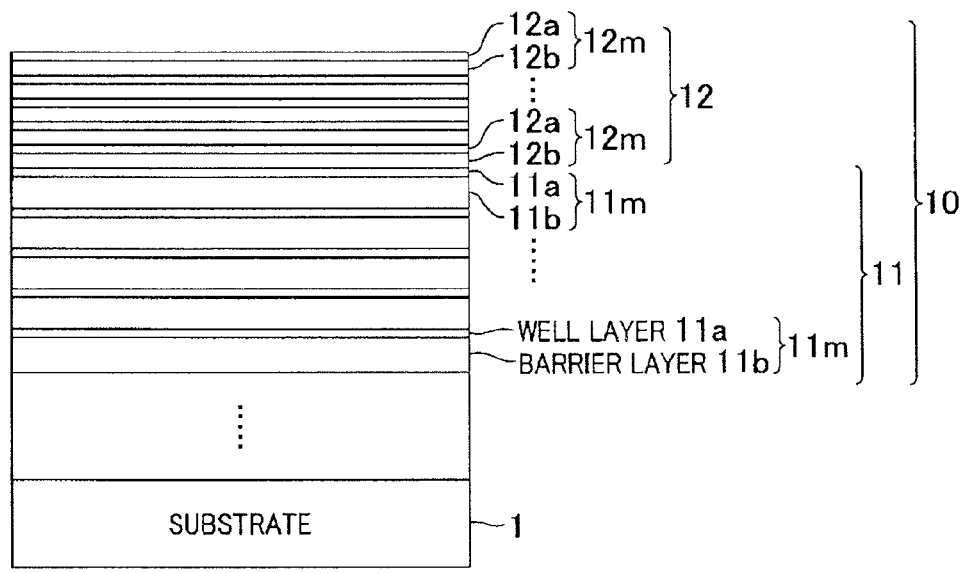
FIG. 2 is a schematic cross-sectional view showing a constitution example of a light-emitting layer according to the present invention.

FIG. 2 is a schematic cross-sectional view showing a constitution example of a light-emitting layer according to the present invention. In FIG. 2, a light-emitting layer 10 on a substrate 1 is constituted of multilayer portions 11 and 12. The multi layer portion 11 comprises five unit multilayer portions 11m, and the multilayer portion 12 comprises five unit multilayer portions 12m.

The unit multilayer portion 11m of the multilayer portion 11 is constituted of a barrier layer 11b having a thickness of 10 nm and a well layer 11a joined onto the barrier layer 11b and having a thickness of 2 nm. The composition of the well layer 11a is $Ga_{0.75}In_{0.25}N$.

The unit multilayer portion 12m of the multilayer portion 12 is constituted of a barrier layer 12b having a thickness of 4 nm and a well layer 12a joined onto the barrier layer 12b. The thickness and composition of the well layer 12a are the same as those of the well layer 11a.

Figure 3:
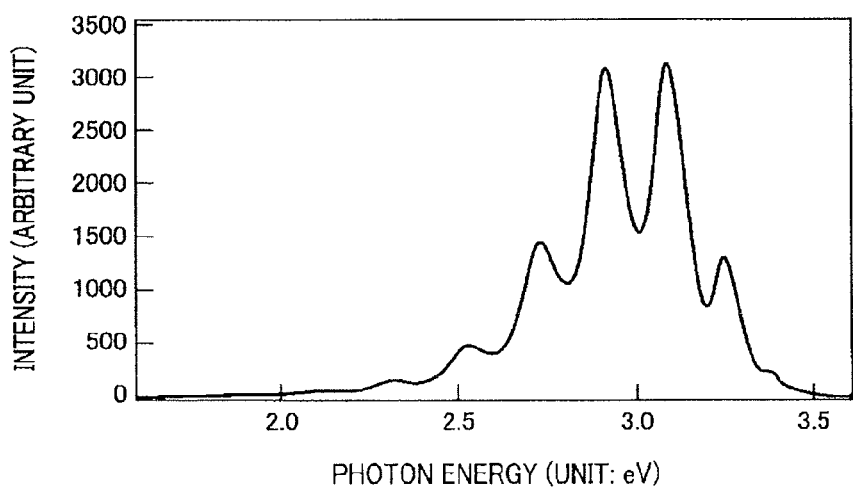
FIG. 3 is a photoluminescence (PL) spectrum of light emitted from the light-emitting layer having the constitution of FIG. 2.

A photoluminescence (PL) spectrum of light emitted from the light-emitting layer 10 having the constitution of FIG. 2 is shown in FIG. 3.

Figure 4:
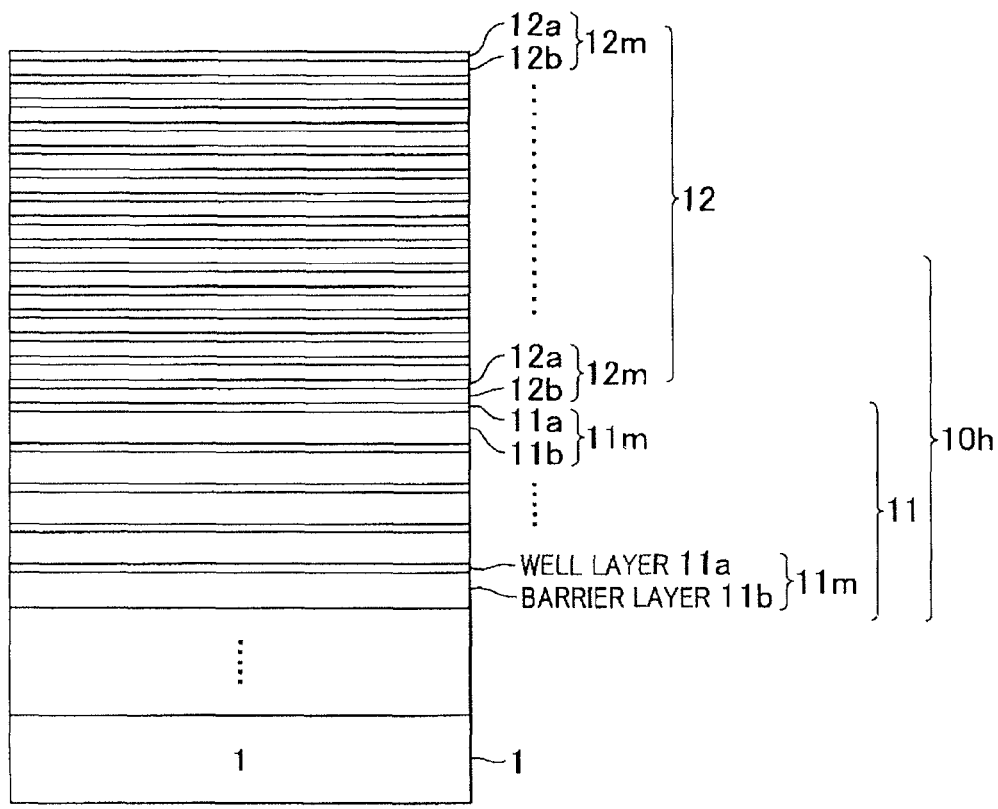
FIG. 4 is a schematic cross-sectional view showing a light-emitting layer constituted so that the number of barrier layers with a smaller thickness is increased relative to the light-emitting layer of FIG. 2.

FIG. 4 is a schematic cross-sectional view showing a case where the number of the unit multilayer portions having thinner barrier layers in the multilayer portion is increased relative to the light-emitting layer of FIG. 2. In FIG. 4, in the multilayer portion 11, the number of the unit multilayer portions 11m having the barrier layer 11b with a thickness of 10 nm remains 5, but, in the multilayer portion 12, the number of the unit multilayer portions 12m having the barrier layer 12b with a thickness of 4 nm is increased from 5 to 15.

Figure 5:
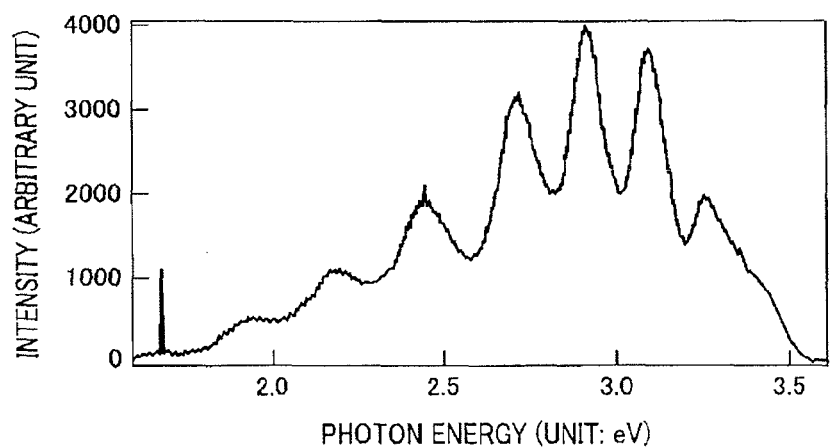
FIG. 5 is a photoluminescence (PL) spectrum of light emitted from the light-emitting layer having the constitution of FIG. 4.

The photoluminescence (PL) spectrum of light emitted from a light-emitting layer 10h having the constitution of FIG. 4 is shown in FIG. 5.

In FIG. 3, the multiwavelength light appears in a photon energy range of not less than 2.3 electron volts (eV) and not more than 3.4 eV. Meanwhile, in FIG. 5, by virtue of the increase in the number of the unit multilayer portions 12m having the thinner barrier layer 12b in the multilayer portion 12, the intensity is increased in a wide wavelength range compared with the spectrum shown in FIG. 3, and the energy range in which the multiwavelength light appears can be widened to not less than 1.9 eV and not more than 3.4 eV.

In particular, when the total number of the unit multilayer portions constituting the entire light-emitting layer is not less than 4 and not more than 30, and the number of the unit multilayer portions having thinner barrier layers in the multilayer portion is not less than 2 and not more than 20, it is possible to easily form a light-emitting layer which emits multiwavelength light in a wide wavelength range without requiring a redundant formation process of the light-emitting layer. In addition, it is advantageous to suppress alteration of a barrier layer due to thermal diffusion of indium contained in a well layer caused by a redundant growth of the light-emitting layer at a high temperature and suppress non-flattening of a joint surface with a barrier layer.

The well layer constituting each unit multilayer portion of the multilayer portion is preferably composed of a Group III nitride semiconductor layer containing indium (In), for example, a $Ga_XIn_{1-X}N$ ($0 \leq X < 1$) layer. This is because high intensity emission can be generally obtained from the indium-containing Group III nitride semiconductor layer. In a Group III nitride semiconductor multiwavelength light-emitting device according to the present invention, the thickness of the well layer is preferably not less than 1 nm and not more than 20 nm, more preferably not less than 2 nm and not more than 10 nm.

When a light-emitting layer having the multiple quantum well structure is formed by stacking multilayer portions which have well layers constituted of indium-containing Group III nitride semiconductor layers with different thicknesses or compositions, the wavelengths of lights emitted from a single light-emitting layer can be further multiplexed. For example, a well layer of one multilayer portion is constituted of $Ga_XIn_{1-X}N$ ($0 \leq X < 1$), and a well layer of another multilayer portion may be constituted of $Ga_YIn_{1-Y}N$ ($0 \leq Y < 1$, $X \neq Y$) different from $Ga_XIn_{1-X}N$ in gallium composition ratio (=X) and indium composition ratio (=1−X). The case where the layer thickness or the composition is different includes a case where both the layer thickness and the composition are different.

Figure 6:
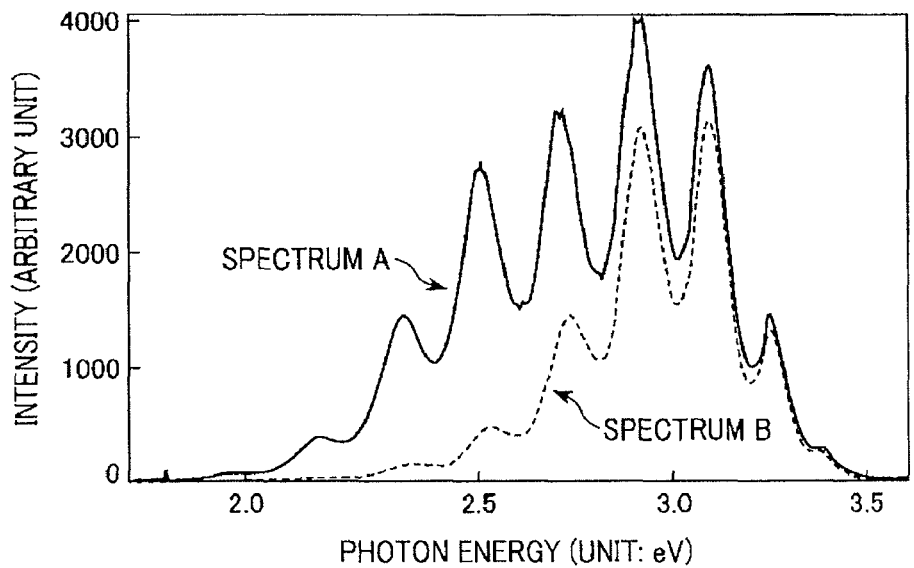
FIG. 6 is a photoluminescence (FL) spectrum of light emitted from light-emitting layers A and B.

For example, a light-emitting layer A comprising two kinds of multilayer portions is formed. The one multilayer portion is constituted of three stacked unit multilayer portions comprising a well layer having a thickness of 2 nm and a composition of $Ga_{0.80}In_{0.20}N$ and a barrier layer having a thickness of 10 nm, and the other multilayer portion is constituted of three stacked unit multilayer portions comprising a well layer having the same composition and a thickness of 4 nm and a barrier layer having a thickness of 6 nm. FIG. 6 shows the photoluminescence (PL) spectrum A representing multiwavelength light emitted from the light-emitting layer A comprising a total of six unit multilayer portions (the PL spectrum A is represented as "spectrum A" in FIG. 6).

By way of comparison with the light-emitting layer A, a light-emitting layer B comprising two kinds of multilayer portions is formed. The one multilayer portion is constituted of three stacked unit multilayer portions comprising a well layer having a thickness of 2 nm and a composition of $Ga_{0.80}In_{0.20}N$ and a barrier layer having a thickness of 10 nm, and the other multilayer portion is constituted of three stacked unit multilayer portions comprising a well layer having the same thickness (=2 nm) and composition as those of the well layer of the one multilayer portion and a barrier layer having a thickness of 6 nm. Thus, in the light-emitting layer A, both the thickness of the well layer and the thickness of the barrier layer are different between the multilayer portions; meanwhile, in the light-emitting layer B, only the thickness of the barrier layers is different between the multilayer portions. FIG. 6 shows, by a dashed line, a photoluminescence (PL) spectrum B representing multiwavelength light emitted from the light-emitting layer B comprising a total of six unit multilayer portions (the PL spectrum B is represented as "spectrum B" in FIG. 6).

When the multiwavelength emission (the spectrum A) emitted from the light-emitting layer having the multiple quantum well structure comprising a combination of the multilayer portions different in thickness of the well layers is compared with the light emission (the spectrum B) in the case where the well layers have the same thickness, the multiwavelength emission (the spectrum A) covers a wider wavelength range and is more suitable for obtaining white light than the light emission (the spectrum B).

The light-emitting layer having the multiple quantum well structure according to the present invention is formed by being joined to an underlayer such as a clad layer formed on a surface of a substrate, for example. In the substrate, there can be used an insulating or electroconductive crystalline oxide such as sapphire ($\alpha$-$Al_2O_3$ single crystal) and zinc oxide (ZnO) with a polar or nonpolar crystal face as its surface, carbide crystal such as 6H, 4H, or 3C silicon carbide (SiC), and semiconductor crystal such as GaN and silicon (Si). In order to obtain an underlayer with high crystalline quality, it is possible to adopt such a stacked constitution that a functional layer for use in reduction of lattice mismatch and so on is provided on a substrate.

The light-emitting layer having the multiple quantum well structure is formed on a substrate or an underlayer grown on the substrate by using a vapor-phase epitaxial method, such as a metal organic chemical vapor deposition (abbreviated to, for example, MOCVD or MOVPE) method, a molecular beam epitaxial (MBE) method, a hydride method, and a halide method. The light-emitting layer having the multiple quantum well structure and a functional layer constituting other multiwavelength light-emitting devices are not necessarily formed by the same vapor-phase epitaxial method. For example, when an LED is constituted using a relatively thick clad layer, the thick film layer can be formed by an MOCVD method or a hydride method, and the multiple quantum well structure that is a thin film superlattice structure can be grown by an MBE method more excellent in controllability of a thin film.

The above vapor-phase epitaxial method can adopt doping means that intentionally adds impurities for use in control of the conductivity type of a barrier layer or a well layer and adjustment of the electrical conductivity. It is preferable that the impurities are doped so that the carrier concentration of the well layer or the barrier layer is in a range of not less than $5 \times 10^{17}$ $cm^{-3}$ and not more than $5 \times 10^{19}$ $cm^{-3}$. An ohmic electrode is provided on a conductive functional layer having such a carrier concentration, such as a clad layer and a contact layer, and a light-emitting device such as an LED is formed. For example, an ohmic electrode is formed so as to be in contact with an n-type $Al_XGa_{1-X}N$ ($0 \leq X \leq 1$) clad layer which is an underlayer of the light-emitting layer having the multiple quantum well structure and a p-type GaN contact layer provided on the light-emitting layer, and thereby a p-n junction type LED which can emit multiwavelength simultaneously is provided.

As described above, in the embodiments of this invention, the light-emitting layer having the multiple quantum well structure is constituted by stacking a plurality of multilayer portions which comprise one or two or more stacked unit multilayer portions comprising the well layer and the barrier layer, and in the respective multilayer portions, the thicknesses of the barrier layers of the unit multilayer portions are different from each other. The smaller the thickness of the barrier layer, the easier the transmission of light (electron wave) emitted from the well layer, and therefore, the reduction in thickness of the barrier layer can increase the intensity of the multiwavelength light emitted from the well layer in a wide wavelength range. Thus, there can be obtained the effect that the wavelength of light emitted from a single light-emitting layer having the multiple quantum well structure can be further multiplexed, and white light can be easily obtained with a simple constitution. Consequently, the light-emitting layers each emitting red, green, and blue light or the light-emitting layers each emitting lights of two colors in a complementary relation are not required to be separately provided.

In the light-emitting layer having the multiple quantum well structure, the number of the stacked unit multilayer portions having the barrier layer with the largest thickness is smaller than the summation of the number of the stacked unit multilayer portions having the barrier layer with a thinner thickness. Therefore, the intensity of the multiwavelength light emitted from the well layer can be effectively increased in a wide wavelength range, and the wavelength range can be further widened.

In the multilayer portions, the well layers of the unit multilayer portions are different in at least one of thickness or composition with respect to one another. When the well layers are different from each other in thickness or composition, the wavelength of the light emitted from the well layer is changed accordingly. Thus, the wavelength of the light emitted from a single light-emitting layer having the multiple quantum well structure can be further multiplexed, and the wavelength range can be widened.

Hereinafter, the Group III nitride semiconductor light-emitting device according to the present invention will be described by first to fourth embodiments. The first embodiment describes with reference to FIGS. 7 to 9 a Group III nitride semiconductor LED comprising a light-emitting layer having a multiple quantum well structure comprising multilayer portions having well layers with different compositions and barrier layers with different thicknesses.

First Embodiment

Figure 7:
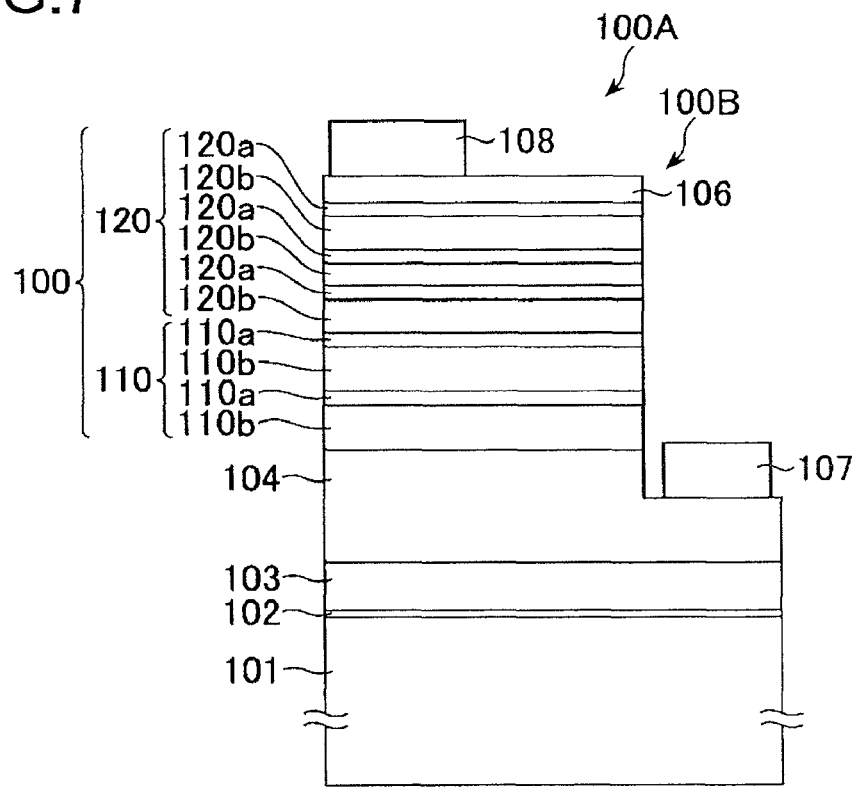
FIG. 7 is a schematic cross-sectional view showing a constitution of a Group III nitride semiconductor light-emitting device comprising a light-emitting layer of a first embodiment.
Figure 8:
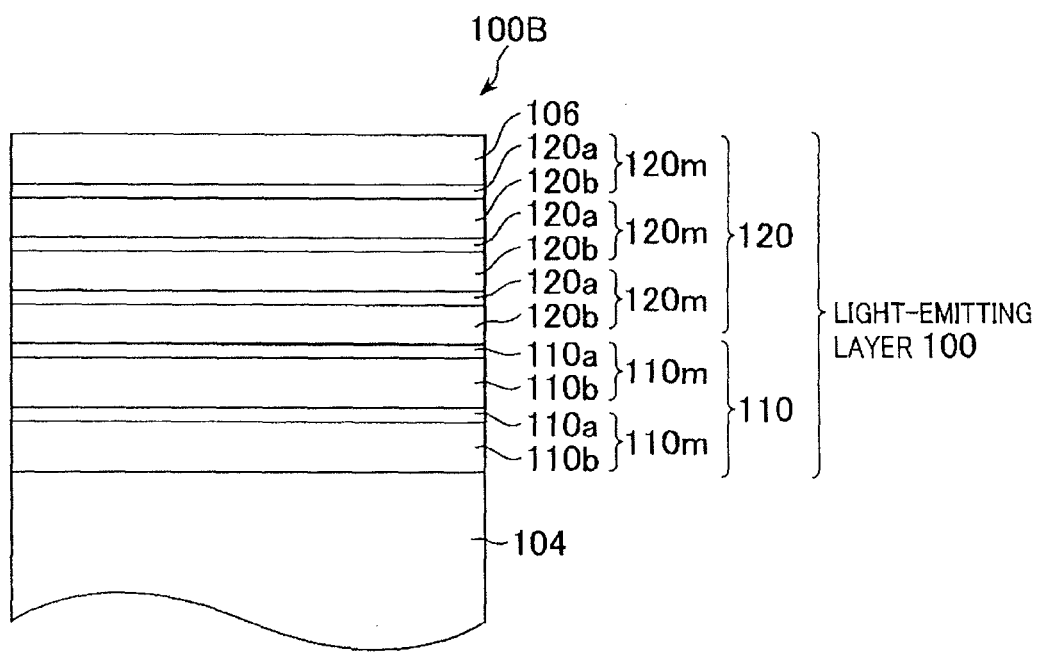
FIG. 8 is a schematic cross-sectional view showing a constitution of the light-emitting layer of the first embodiment.
Figure 9:
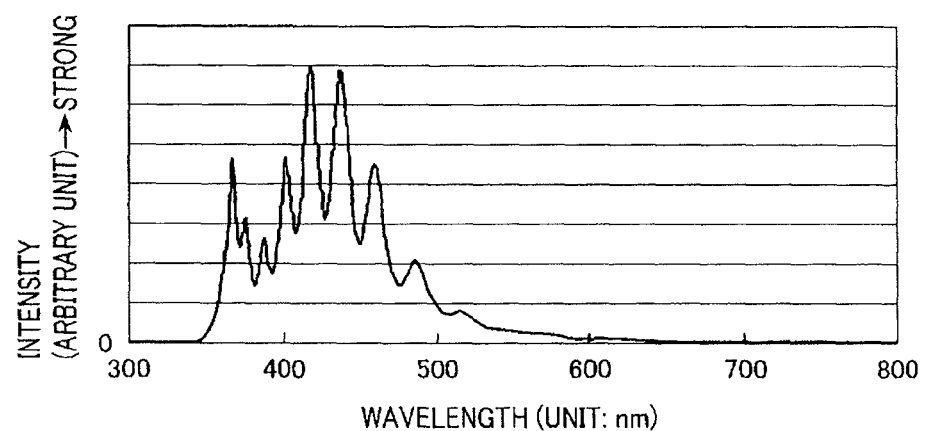
FIG. 9 is a photoluminescence (PL) spectrum at room temperature emitted from the light-emitting layer of the first embodiment.

FIG. 7 is a schematic cross-sectional view showing a constitution of a Group III nitride semiconductor light-emitting device comprising the light-emitting layer of a first embodiment. FIG. 8 is a schematic cross-sectional view showing a constitution of the light-emitting layer. FIG. 9 is a photoluminescence (PL) spectrum at room temperature emitted from the light-emitting layer.

A stacked structure 100B for use in production of a Group III nitride semiconductor light-emitting device 100A was formed using {111} p-type silicon single crystal (silicon) as a substrate 101. The surface of the substrate 101 was exposed to nitrogen plasma in a molecular beam epitaxial (MBE) apparatus retained in vacuum and subjected to a nitriding treatment to alter an immediate vicinity of the surface of the substrate 101 to silicon nitride (SiN). Then, by virtue of the MBE method (nitrogen plasma MBE method) using nitrogen plasma, a first buffer layer 102 formed of aluminum nitride (AlN) (thickness=60 nm) was formed on the surface of the substrate 101, subjected to the nitridation treatment, at the temperature of 650° C. Then, the temperature of the substrate 101 was increased to 850° C., a second buffer layer 103 formed of AlN (thickness=300 nm) was formed by the nitrogen plasma MBE method. Then, the temperature of the substrate 101 was lowered to 690° C., an n-type clad layer 104 formed of GaN (thickness=1.5 µm) was formed by the nitrogen plasma MBE method.

After the formation of the n-type clad layer 104, the stacked structure was cooled in an MBE apparatus until the temperature was lowered to a temperature near room temperature. Thereafter, the stacked structure was taken out from the MBE apparatus to be conveyed in a general MOCVD apparatus.

After that, in a hydrogen atmosphere, at the time when the temperature of the substrate 101 was 700° C., a unit multilayer portion 110m was formed on the n-type clad layer 104. The unit multilayer portion 110m comprises a barrier layer 110b having a thickness of 8 nm and formed of n-type GaN and a well layer 110a having a thickness of 2 nm. The two unit multilayer portions 110m were stacked to provide a multilayer portion 110. Each well layer 110a of the multilayer portion 110 is constituted of an n-type $Ga_{0.75}In_{0.25}N$ layer. The multilayer portion 110 was stacked on the n-type clad layer 104 so that the barrier layer 110b was joined to the surface of the n-type clad layer 104.

Three unit multilayer portions 120m constituting a multilayer portion 120 are sequentially stacked on the multilayer portion 110 at 700° C. by the MOCVD method. The unit multilayer portion 120m comprises a barrier layer 120b having a thickness of 6 nm and formed of an n-type GaN layer and a well layer 120a having a thickness of 2 nm. As shown in FIG. 8, the multilayer portion 120 is provided on the multilayer portion 110 so that the barrier layer 120b of the multilayer portion 120 is joined to the well layer 110a which is the surface layer of the multilayer portion 110. The well layers 120a of the multilayer portion 120 are different from the well layers 110a of the multilayer portion 110, and they are constituted of an n-type $Ga_{0.85}In_{0.15}N$ layer. A total of five unit multilayer portions 110m and 120m of the multilayer portions 110 and 120 are stacked to constitute the light-emitting layer 100 having the multiple quantum well structure (see, FIG. 8). The thickness of each of the barrier layers 120b of the three unit multilayer portions 120m is thinner than the thickness of each of the barrier layers 110b of the two unit multilayer portions 110m.

FIG. 9 shows the photoluminescence spectrum at room temperature from the light-emitting layer 100 in which the summation of the number of the stacked unit multilayer portions having thinner barrier layers is increased. The emission is generated in a wide wavelength range from 373 nm to 750 nm.

Due to mixing the colors of light simultaneously emitted various wavelengths from the light-emitting layer 100, a white color is provided as a visible color. Namely, for example, for the purpose of acquiring the emission of lights of two colors in a complementary relation, such as a combination of blue and yellow, or for the purpose of acquiring the emission of light of each color of R, G, and B, even when the light-emitting layers corresponding to each color are not separately formed of different compound semiconductor materials, the multiple quantum well structure comprising the constitution according to the present invention is used, whereby the single light-emitting layer which can independently emit white light can be formed of the same kind of Group III nitride semiconductor materials.

After the formation of the light-emitting layer 100, the light-emitting layer 100 was cooled to a temperature near room temperature in the MOCVD apparatus. Thereafter, the stacked structure 100B after the formation of the light-emitting layer 100 was taken out from the MOCVD apparatus to be then conveyed into a nitrogen plasma MBE apparatus. When the temperature of the substrate 101 was set to 780° C., a p-type clad layer 106 formed of p-type GaN was stacked on the well layer 120a which constitutes the surface layer of the light-emitting layer 100 having the multiple quantum well structure. According to this constitution, the formation of the stacked structure 100B for use in the light-emitting device 100A, which comprises a p-n junction type light-emitting part having such a constitution that the n-type light-emitting layer 100 is held between the n-type GaN clad layer 104 and the p-type GaN clad layer 106, was terminated.

The p-type GaN clad layer 106 and the light-emitting layer 100 existing in a region where an n-type ohmic electrode 107 provided at one end of the stacked structure 100E was formed were removed by a general dry etching method and the surface of the n-type GaN clad layer 104 which is an underlayer of the light-emitting layer 100 was exposed. Then, the n-type ohmic electrode 107 was formed on the surface of the exposed n-type GaN clad layer 104. Meanwhile, a p-type ohmic electrode 108 was formed on a portion of the surface of the p-type GaN clad layer 106 and then the stacked structure 100 B was divided into individual device (chips), and the light-emitting device 100A having a side length of 350 µm was produced.

When the forward current of the light-emitting device 100A was 20 mA, the forward voltage (Vf) was 3.5 V. When a current of 50 mA was passed in a forward direction, white light tinged with blue visually was emitted from the entire surface of the light-emitting layer of the light-emitting device 100A in a chip state. According to this constitution, by virtue of the use of the light-emitting layer having the multiple quantum well structure of the first embodiment, simultaneous emission of lights with different wavelengths can be realized, and therefore, it was shown that even though a light-emitting layer having a single quantum well structure is used, the light-emitting device capable of emitting white light can be easily produced.

Second Embodiment

Figure 10:
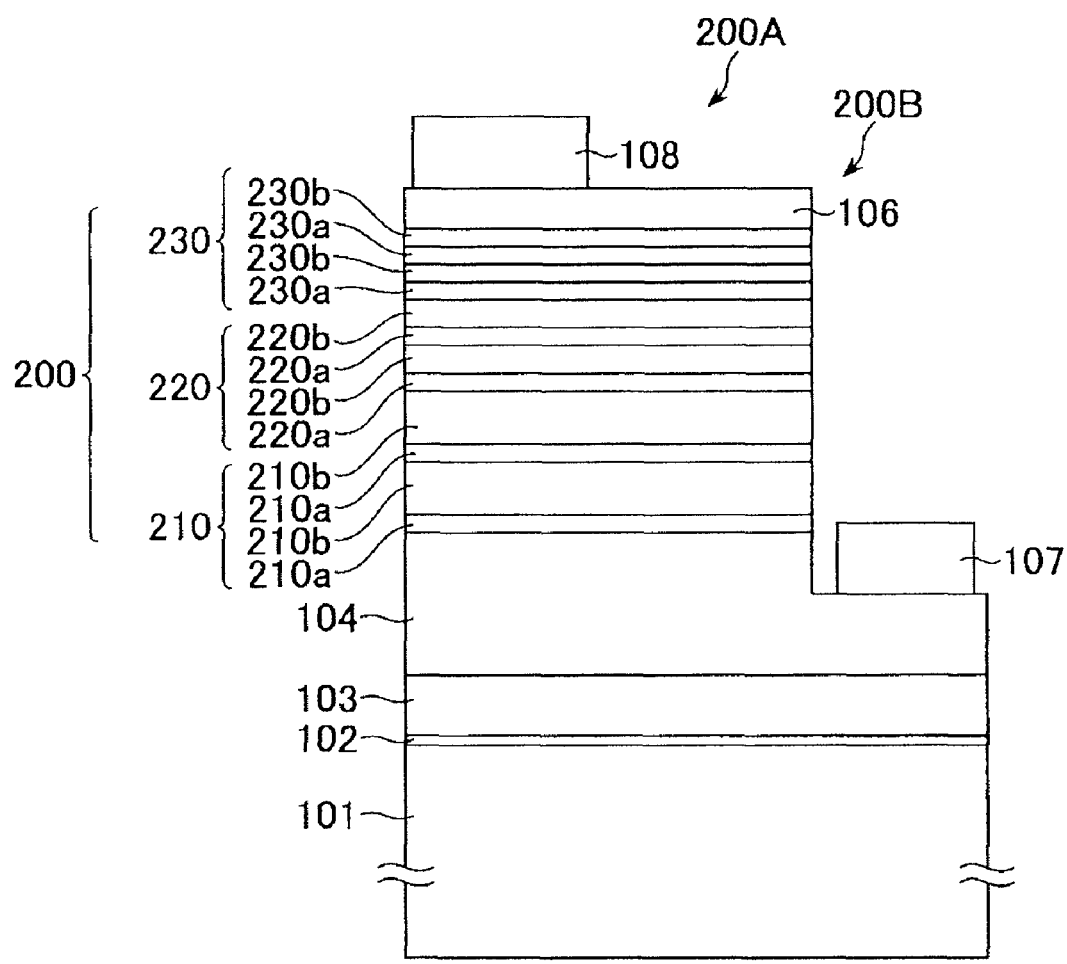
FIG. 10 is a schematic cross-sectional view showing a constitution of a Group III nitride semiconductor light-emitting device comprising a light-emitting layer of a second embodiment.
Figure 11:
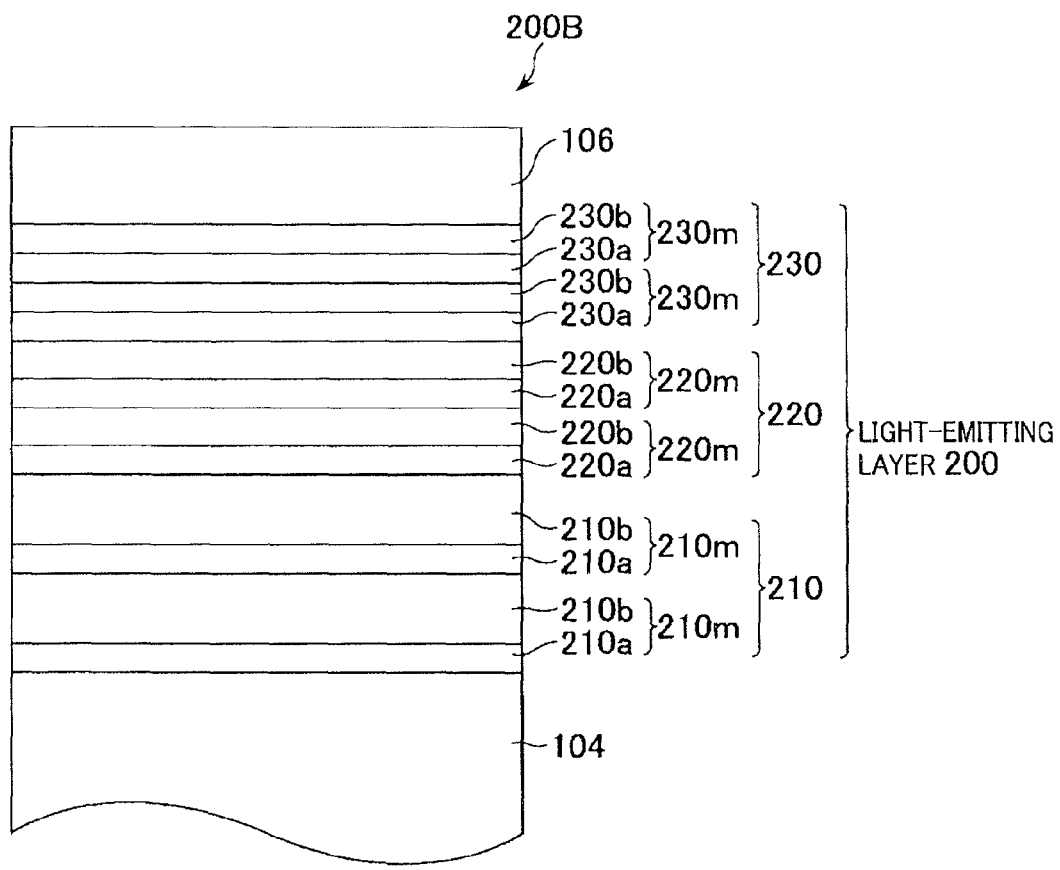
FIG. 11 is a schematic cross-sectional view showing a constitution of the light-emitting layer of the second embodiment.
Figure 12:
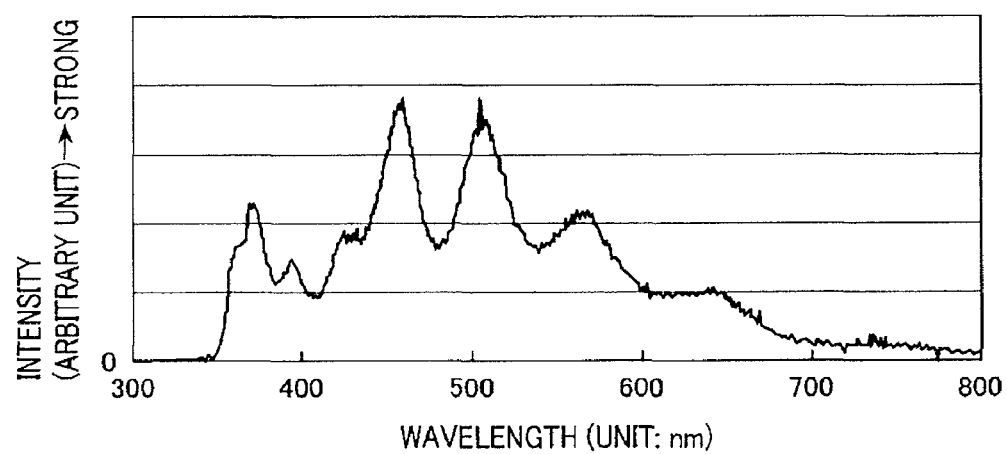
FIG. 12 is a photoluminescence (PL) spectrum at room temperature emitted from the light-emitting layer of the second embodiment.

A second embodiment describes, with reference to FIGS. 10 to 12, the Group III nitride semiconductor light-emitting device according to the present invention, which comprises a light-emitting layer having a multiple quantum well structure comprising multilayer portions different in thickness of the barrier layers.

FIG. 10 is a schematic cross-sectional view showing a constitution of a Group III nitride semiconductor light-emitting device comprising the light-emitting layer of the second embodiment. FIG. 11 is a schematic cross-sectional view showing a constitution of the light-emitting layer. FIG. 12 is a photoluminescence (PL) spectrum at room temperature emitted from the light-emitting layer. In FIGS. 10 and 11, the same components as those in the first embodiment are assigned the same reference numerals.

AlN layers 102 and 103 produced at different growth temperatures and a clad layer 104 formed of n-type GaN were formed in that order on the Si substrate 101 with a nitrided surface of the first embodiment, and a light-emitting layer 200 with a constitution different from that of the first embodiment was formed on the clad layer 104. The light-emitting layer 200 comprises multilayer portions 210, 220, and 230. Those multilayer portions are formed by a method different from the formation method of the light-emitting layer 100 described in the first embodiment, and they were formed by the nitrogen plasma. MBE method.

In the light-emitting layer 200 having the multiple quantum well structure of the second embodiment, well layers 210a, 220a, and 230a are the same as each other, and they are $Ga_{0.75}In_{0.25}N$ layers having a thickness of 4 nm. As shown in FIG. 11, a barrier layer 210b having a thickness of 10 nm and formed of n-type GaN was provided on the well layer 210a to form a unit multilayer portion 210m, and the two unit multilayer portions 210m were stacked to provide the multilayer portion 210.

A barrier layer 220b having a thickness of 6 nm and formed of n-type GaN was formed on the well layer 220a to form a unit multilayer portion 220m, and the two unit multilayer portions 220m were stacked to provide the multilayer portion 220 on the multilayer portion 210.

A barrier layer 230b having a thickness of 4 nm and formed of n-type GaN was formed on the well layer 230a to provide a unit multilayer portion 230m, and the two unit multilayer portions 230m were stacked to provide the multilayer portion 230 on the multilayer portion 220.

In the formation of the multilayer portions 210, 220, and 230, the well layer 210a was first joined to the clad layer 104 to provide the multilayer portion 210. The well layer 220a was joined to the barrier layer 210b of the multilayer portion 210 to provide the multilayer portion 220. The well layer 230a was joined to the barrier layer 220b of the multilayer portion 220 to provide the multilayer portion 230.

The p-type clad layer 106 formed of p-type GaN described in the first embodiment was stacked on the light-emitting layer 200 formed as described above. According to this constitution, the formation of the stacked structure 200B for use in the light-emitting device 200A, which comprises a p-n junction type light-emitting part having such a constitution that the n-type light-emitting layer 200 having the multiple quantum well structure is held between the n-type clad layer 104 and the p-type GaN clad layer 106, was terminated.

In the multilayer portion 210, the two unit multilayer portions 210m are stacked, and compared with this, in the multilayer portions 220 and 230 having the barrier layers thinner than the barrier layers of the multilayer portion 210, a total of four unit multilayer portions 220m and 230m are stacked. In the light-emitting layer 200, the summation of the number of the stacked unit multilayer portions having thinner barrier layers is further increased. FIG. 12 shows the photoluminescence spectrum at room temperature from the light-emitting layer 200. The emission is generated in a wide wavelength range from 367 nm to 516 nm. Thus, the visible color of light emitted from the light-emitting layer 200 is white due to mixing of colors of multiple lights with different wavelengths. Namely, for the purpose of acquiring the emission of light of two colors in a complementary relation, such as a combination of blue and yellow, or for the purpose of acquiring the emission of light of each color of R, G, and B, even when the light-emitting layers corresponding to the respective colors are not separately formed, by virtue of the use of the multiple quantumwell structure comprising the constitution according to the present invention, the single light-emitting layer which independently emits white light can be obtained.

The p-type GaN clad layer 106 and the light-emitting layer 200 existing in a region where an n-type ohmic electrode 107 provided at one end of the stacked structure 200B was formed were removed by a general dry etching method to expose the surface of the n-type GaN clad layer 104 which is an underlayer of the light-emitting layer 200. Then, the n-type ohmic electrode 107 was formed on the surface of the exposed n-type GaN clad layer 104. Meanwhile, a p-type ohmic electrode 108 was formed on a portion of the surface of the p-type GaN clad layer 106. Thereafter, the stacked structure 200B was divided into individual device (chips) and thereby the light-emitting device 200A having a size of 400 μM square was produced.

When the forward current of the light-emitting device 200A was 20 mA, the forward voltage (Vf) was 3.4 V. When a current of 20 mA was passed in a forward direction, white light tinged with green visually was emitted from the entire surface of the light-emitting layer of the light-emitting device 200A in a chip state. According to this constitution, by virtue of the use of the light-emitting layer having the multiple quantum well structure of the second embodiment, simultaneous emission of lights with different wavelengths can be realized, and therefore, it was shown that even though a light-emitting layer having a single quantumwell structure is used, the light-emitting device capable of emitting white light can be easily produced.

Third Embodiment

A third embodiment describes the Group III nitride semiconductor light-emitting device according to the present invention, which comprises a light-emitting layer having a multiple quantum well structure comprising multilayer portions constituted of the well layers different in In composition and the barrier layers different in thickness.

A light-emitting layer having a constitution different from that in the second embodiment and constituted of three multilayer portions was formed on an AlN layer, which was provided on the Si substrate with a nitrided surface of the first embodiment, and a clad layer formed of n-type GaN. The three multilayer portions constituting the light-emitting layer were formed by the nitrogen plasma MBE method.

The light-emitting layer having the multiple quantum well structure of the third embodiment was constituted so that the first to third multilayer portions were stacked in sequence from the Si substrate side toward a direction of taking out light emission. Although the well layers of the unit multilayer portions constituting the first to third multilayer portions have the same thickness of 4 nm, they are constituted of n-type $Ga_xIn_{1-x}N$ layers with different In compositions ($=1-X$). The well layer constituting the unit multilayer portion of the first multilayer portion disposed closest to the surface of the Si substrate is constituted of $Ga_{0.72}In_{0.28}N$ layer. The well layer constituting the unit multilayer portion of the second multilayer portion stacked on the first multilayer portion is constituted of $Ga_{0.80}In_{0.20}N$ layer. The well layer constituting the unit multilayer portion of the third multilayer portion which is stacked on the second multilayer portion and is the uppermost portion in the light-emission taking-out direction is constituted of $Ga_{0.85}In_{0.15}N$ layer.

Namely, the light-emitting layer having the multiple quantum well structure is constituted so that the first to third multilayer portions are stacked in the order that the wavelengths of the lights emitted from the first to third multilayer portions are gradually shortened from the surface side of the Si substrate toward the direction of taking-out light-emission. The number of the stacked unit multilayer portions constituting the first multilayer portion is 3, the number of the stacked unit multilayer portions constituting the second multilayer portion is 3, and the number of the stacked unit multilayer portions constituting the third multilayer portion is 2. The first multilayer portion was formed by joining a $Ga_{0.72}In_{0.28}N$ well layer of the unit multilayer portion to an n-type GaN clad layer under the first multilayer portion. The second multilayer portion was formed by joining a $Ga_{0.80}In_{0.20}N$ well layer of the unit multilayer portion constituting the second multilayer portion to an n-type GaN barrier layer as the surface of the first multilayer portion. The third multilayer portion was formed by joining a $Ga_{0.85}In_{0.15}N$ well layer to the surface of an n-type GaN barrier layer as the surface of the second multilayer portion.

Although the barrier layers constituting the unit multilayer portions of the first to third multilayer portions are constituted of n-type GaN layers, the thicknesses of the barrier layers are different in the respective multilayer portions. The thickness of the barrier layer constituting the unit multilayer portion of the first multilayer portion is 8 nm. The thickness of the barrier layer constituting the unit multilayer portion of the second multilayer portion stacked on the first multilayer portion is 6 nm. The thickness of the barrier layer constituting the unit multilayer portion of the third multilayer portion which is stacked on the second multilayer portion and is the uppermost portion in the direction of taking-out light-emission is 4 nm. Namely, the light-emitting layer was formed so that the number of the stacked unit multilayer portions constituting the first multilayer portion having a barrier layer with the largest thickness is three as described above, and, relative to this, the total number (=5) of the stacked unit multilayer portions constituting the second and third multilayer portions having barrier layers thinner than the barrier layer of the first multilayer portion is increased.

Thereafter, a p-type clad layer formed of p-type GaN described in the first embodiment was stacked on the light-emitting layer having the multiple quantum well structure of the above constitution, and a stacked structure for use in an LED comprising a p-n junction type light-emitting part was formed. The processing similar to that described in the first and second embodiments was applied to the stacked structure, and n-type and p-type ohmic electrodes were formed to produce a light-emitting device.

The fabricated light-emitting device emits white light with a high intensity, which provides a spectrum similar to that shown in FIG. 12, in a wide wavelength range from 370 nm to 650 nm.

In the third embodiment, the light-emitting layer has a constitution that the multilayer portions are arranged so that, from the surface side of the substrate toward the direction of taking out light emitted from the light-emitting layer, the wavelengths of the lights emitted from the multilayer portions are shortened in sequence, that is, the In compositions of the $Ga_XIn_{1-X}N$ well layers of the multilayer portions become smaller in sequence. Namely, the light-emitting layer having the multiple quantum well structure is constituted so that the multilayer portion including the well layer providing multi-wavelength emission having a low quantum level and including a long-wavelength emission component is disposed on the surface side of the substrate, and the multilayer portions each including the well layers providing multiwavelength emission having a high quantum level and including a shorter wavelength emission component are disposed in sequence in the direction of taking-out light-emission. Thus, it is considered that the high intensity white light emission is obtained because, by virtue of the constitution that does not allow light with a short wavelength to pass through the multilayer portion including the well layer emitting light with a longer wavelength, the light emitted from the well layer of the multilayer portion disposed on the surface side of the substrate can be transmitted in an external visual field direction without being absorbed in the well layer of the multilayer portion disposed in the direction of taking-out light-emission, and thus the lights over a wide wavelength range emitted from each well layer constituting the multilayer portion can be efficiently taken out in a visual field direction.

Fourth Embodiment

A fourth embodiment describes the Group III nitride semiconductor light-emitting device according to the present invention comprising a light-emitting layer having a multiple quantum well structure comprising a multilayer portion which is constituted of well layers having different thicknesses while having the same In composition and barrier layers with different thicknesses.

A light-emitting layer comprising four multilayer portions was formed on an AlN layer provided on the Si substrate with a nitrided surface of the first embodiment and a clad layer formed of n-type GaN. The four multilayer portions (first to fourth multilayer portions) constituting the light-emitting layer were formed by the nitrogen plasma MBE method.

The light-emitting layer having the multiple quantum well structure of the fourth embodiment was constituted so that the first to fourth multilayer portions were stacked in that order from the Si substrate side toward the direction of taking out light emission. The first to fourth multilayer portions each have single unit multilayer portion. The well layers of the unit multilayer portion are constituted of n-type $Ga_{0.82}In_{0.18}N$ layers having the same In composition of 0.18. The thickness of the well layer constituting the unit multilayer portion of the first multilayer portion disposed closest to the surface of the Si substrate is 8 nm. The thickness of the well layer constituting the unit multilayer portion of the second multilayer portion stacked on the first multilayer portion is 6 nm. The thickness of the well layer constituting the unit multilayer portion of the third multilayer portion stacked on the second multilayer portion is 4 nm. The thickness of the well layer constituting the unit multilayer portion of the fourth multilayer portion which is stacked on the third multilayer portion and located at the uppermost portion in the light-emission taking-out direction is 2 nm.

Although the barrier layers constituting the unit multilayer portions of the first to fourth multilayer portions are constituted of the n-type GaN layers, the thickness of the barrier layer in each multilayer portion is different with respect to one another. The barrier layer constituting the unit multilayer portion of the first multilayer portion has a thickness of 10 nm. The barrier layer constituting the unit multilayer portion of the second multilayer portion stacked on the first multilayer portion has a thickness of 8 nm. The barrier layer constituting the unit multilayer portion of the third multilayer portion stacked on the second multilayer portion has a thickness of 6 nm. The barrier layer constituting the unit multilayer portion of the fourth multilayer portion, which is stacked on the third multilayer portion and is the uppermost portion in the direction of taking-out light-emission, has a thickness of 4 nm. Namely, the light-emitting layer is constituted so that the unit multilayer portion constituting the first multilayer portion having the barrier layer with the largest thickness (10 nm) is single as described above, and, relative to this, the total number (=3) of the stacked unit multilayer portions constituting the second to fourth multilayer portions having the barrier layers thinner than the barrier layer of the first multilayer portion is increased.

Namely, the light-emitting layer having the multiple quantum well structure is constituted by stacking the multilayer portions (the first to fourth multilayer portions are stacked in that order) so that the wavelengths of the lights emitted from the multilayer portions are shortened in sequence from the surface side of the Si substrate toward the direction of taking-out light-emission. The first multilayer portion was formed so that a $Ga_{0.82}In_{0.18}N$ well layer of the unit multilayer portion was joined to an n-type GaN clad layer under the first multilayer portion. The second multilayer portion was formed so that a $Ga_{0.82}In_{0.18}N$ well layer of the unit multilayer portion constituting the second multilayer portion was joined to an n-type GaN barrier layer as the surface of the first multilayer portion. The third multilayer portion was formed so that a $Ga_{0.82}In_{0.18}N$ well layer was joined to the surface of an n-type GaN barrier layer as the surface of the second multilayer portion. Likewise, the fourth multilayer portion was formed so that a $Ga_{0.82}In_{0.18}N$ well layer is joined to the surface of an n-type GaN barrier layer as the surface of the third multilayer portion.

Thereafter, the p-type clad layer formed of p-type GaN, which is described in the first embodiment, was stacked on the light-emitting layer having the multiple quantum well structure of the above constitution, and a stacked structure for use in an LED comprising a p-n junction type light-emitting part was formed. The processing similar to that described in the first and second embodiments was applied to the stacked structure, and n-type and p-type ohmic electrodes were formed to produce a light-emitting device.

The produced light-emitting device emits white light with a high intensity, as with the light-emitting device of the third embodiment. In the fourth embodiment, the light-emitting layer has a constitution that the multilayer portions are arranged so that, from the surface side of the substrate toward the direction of taking out light emitted from the light-emitting layer, the wavelengths of the lights emitted from the multilayer portions are shortened in sequence, that is, the thicknesses of the $Ga_xIn_{1-x}N$ well layers of the multilayer portions become smaller in sequence while the In compositions are the same. Namely, the light-emitting layer having the multiple quantum well structure is constituted so that the multilayer portion including the well layer providing multiwavelength emission having a low quantum level and including a component of long-wavelength emission was disposed on the surface side of the substrate, and the multilayer portions including the well layers providing multiwavelength emission having a high quantum level and including a shorter wavelength emission component were disposed in the direction of taking-out light-emission. Although short-wavelength light is absorbed when passing through the well layer emitting long-wavelength light, in the constitution of the fourth embodiment, none of the short-wavelength light passes through the well layer emitting a longer wavelength light, and therefore, light emitted from the well layer of the multi layer portion disposed on the substrate surface side can be transmitted in the external visual field direction without being absorbed in the well layer of the multilayer portion disposed in the direction of taking-out light-emission, and by combining with the effect obtained by further increasing the summation of the numbers of the multilayer portions including the unit multilayer portions having thinner barrier layers, the light emitted from each well layer constituting the multilayer portion and covering a wide wavelength range can be efficiently taken out in the visual field direction. Thus, the intensity of the emitted multiwavelength light can be increased in a wide wavelength range, and white light emission with high intensity can be obtained.

Industrial Applicability

In a Group III nitride semiconductor light-emitting device according to the present invention, a light-emitting layer having a multiple quantum well structure is constituted by stacking a plurality of multilayer portions which comprise one or two or more stacked unit multilayer portions comprising a well layer and a barrier layer, and the respective multilayer portions are different in thickness of the barrier layer of the unit multilayer portion with respect to one another.

Consequently, the smaller the thickness of the barrier layer, the easier the transmission of light (electron wave) emitted from the well layer, and therefore, the reduction in thickness of the barrier layer can increase the intensity of the multiwavelength light emitted from the well layer in a wide wavelength range.

Thus, there can be obtained the effect that the wavelength of light emitted from a single light-emitting layer having the multiple quantum well structure can be further multiplexed, and white light can be easily obtained with a simple constitution. Consequently, the light-emitting layers each emitting red, green, and blue light or light-emitting layers emitting lights of two colors in a complementary relation are not required to be separately provided.

In the light-emitting layer having the multiple quantum well structure, the number of the stacked unit multilayer portions having the barrier layer with the largest thickness is smaller than the summation of the number of the stacked unit multilayer portions having the barrier layer with a thinner thickness. Therefore, the intensity of the multiwavelength light emitted from the well layer can be effectively increased in a wide wavelength range, and the wavelength range can be further widened, whereby the Group III nitride semiconductor light-emitting device with a high industrial applicability can be provided.

What is claimed is:

1. A Group III nitride semiconductor light-emitting device comprising:
   a substrate; and
   a light-emitting layer having a multiple quantum well structure comprising a barrier layer, which is provided on a surface of the substrate and formed of a Group III nitride semiconductor, and a well layer formed of an indium-containing Group III nitride semiconductor,
   wherein the light-emitting layer having the multiple quantum well structure is constituted by stacking a plurality of multilayer portions which comprise one unit multilayer portion comprising the well layer and the barrier layer or two or more stacked unit multilayer portions,
   in the respective multilayer portions, the barrier layers of the unit multilayer portions are different in thickness,
   in the light-emitting layer, the multilayer portions are arranged from the surface side of the substrate toward a direction of taking out light emitted by the light-emitting layer in the order that the multilayer portion emits lights of shorter wavelength, and when the multilayer portion comprises two or more unit multilayer portions, the respective well layers or the respective barrier layers have the same thickness and composition.

2. The Group III nitride semiconductor light-emitting device according to claim 1, wherein in the light-emitting layer, the number of the stacked unit multilayer portions having the barrier layer with the largest thickness is smaller than the summation of the number of the stacked unit multilayer portions having the barrier layer with a thinner thickness.

3. The Group III nitride semiconductor light-emitting device according to claim 1, wherein in the respective multilayer portions, the well layers of the unit multilayer portions are different in at least one of thickness and composition.

4. The Group III nitride semiconductor light-emitting device according to claim 1, wherein in the light-emitting layer, the multilayer portions are arranged in the sequence that the thicknesses of the well layers of the multilayer portions become thinner from the surface side of the substrate toward the direction of taking out light emitted layer.

* * * * *